(12) United States Patent
Hao et al.

(10) Patent No.: US 11,757,391 B1
(45) Date of Patent: Sep. 12, 2023

(54) IMPEDANCE ESTIMATION OF POWER SOURCES VIA MOTOR INVERTER CIRCUITS

(71) Applicant: GM GLOBAL TECHNOLOGY OPERATIONS LLC, Detroit, MI (US)

(72) Inventors: Lei Hao, Troy, MI (US); Yue-Yun Wang, Troy, MI (US); Steven E. Muldoon, Royal Oak, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 17/676,535

(22) Filed: Feb. 21, 2022

(51) Int. Cl.
| | |
|---|---|
| *H02P 23/14* | (2006.01) |
| *G01R 27/02* | (2006.01) |
| *G01R 31/389* | (2019.01) |
| *B60L 15/20* | (2006.01) |
| *H02P 27/08* | (2006.01) |
| *H02P 29/68* | (2016.01) |

(52) U.S. Cl.
CPC ............ *H02P 23/14* (2013.01); *B60L 15/20* (2013.01); *G01R 27/02* (2013.01); *G01R 31/389* (2019.01); *H02P 27/08* (2013.01); *H02P 29/68* (2016.02)

(58) Field of Classification Search
CPC .......... H02P 23/14; H02P 27/08; H02P 29/68; B60L 15/20; G01R 27/24; G01R 17/105; G01R 27/02; G01R 31/389
See application file for complete search history.

(56) References Cited

U.S. PATENT DOCUMENTS

| | | | | |
|---|---|---|---|---|
| 2007/0080694 | A1* | 4/2007 | Della Malva | G01R 31/389 324/537 |
| 2007/0182355 | A1* | 8/2007 | Ueda | H02P 21/22 318/599 |
| 2013/0030737 | A1* | 1/2013 | Okada | G01R 31/389 702/63 |
| 2019/0285702 | A1* | 9/2019 | Tashiro | G01R 31/3648 |
| 2019/0356263 | A1* | 11/2019 | Sonoda | B60W 30/18127 |

FOREIGN PATENT DOCUMENTS

CN 106505923 A * 3/2017 ............. H02P 21/08

OTHER PUBLICATIONS

U.S. Appl. No. 17/519,989, filed Nov. 5, 2021, Muldoon et al.
U.S. Appl. No. 17/647,962, filed Jan. 13, 2022, Wang et al.

* cited by examiner

*Primary Examiner* — Bickey Dhakal

(57) ABSTRACT

A motor drive system of a vehicle includes: an inverter that receives power from a power source via a bus, where the inverter is connected to a motor of the vehicle; a driver that drives the inverter; a filter that filters a current signal received from the bus to generate a filtered signal; and a control module that operates in an impedance determination mode. The impedance determination mode includes: based on the filtered signal, controlling the driver and the inverter to generate a pulsed signal applied to the power source; determining a current level and a voltage of the power source due to generation of the pulsed signal, and determining impedance based on the current level and the voltage. The control modules are configured to: determine a characterization parameter of the power source based on the impedance; and perform a control operation or a countermeasure based on the characterization parameter.

20 Claims, 12 Drawing Sheets

IMPEDANCE ESTIMATION OF POWER SOURCES VIA MOTOR INVERTER CIRCUITS

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to power sources for electric vehicles.

Electric vehicles include one or more power sources for supplying electrical energy to one or more electric motors. The electric motors are utilized for propulsion purposes and can also be used to reduce speed of the vehicles and recharge, for example, cells of the power sources. As an example, the electric motors may be operated as generators during regenerative braking operation to decelerate the vehicles and/or recharge the power sources.

SUMMARY

A motor drive system of a vehicle is disclosed. The motor drive system includes: an inverter configured to receive power from a power source via a bus, where the inverter is connected to a motor of the vehicle; a driver configured to drive the inverter; a filter configured to filter a current signal received from the bus to generate a filtered signal; and one or more control modules configured to operate in an impedance determination mode. The impedance determination mode includes: based on the filtered signal, controlling the driver and the inverter to generate a pulsed signal applied to the power source; determining a current level and a voltage of the power source due to generation of the pulsed signal, and determining impedance based on the current level and the voltage. The one or more control modules are configured to: determine a characterization parameter of the power source based on the impedance; and perform a control operation or a countermeasure based on the characterization parameter.

In other features, the one or more control modules are configured, while in the impedance determination mode, to generate the pulsed signal to include (i) motor magnetizing flux current, and (ii) a torque producing current of less than a predetermined threshold.

In other features, the one or more control modules are configured, while in the impedance determination mode, to generate the pulsed signal to include (i) motor magnetizing flux current, and (ii) zero torque producing current.

In other features, the one or more control modules are configured to: determine whether at least one of the vehicle is stopped, back electromagnetic force of the motor is less than a first predetermined threshold, a rotor of the motor is not rotating, or output torque of the motor is less than a second predetermined threshold; and when at least one of the vehicle is stopped, the back electromagnetic force of the motor is less than the first predetermined threshold, the rotor of the motor is not rotating, or the output torque of the motor is less than the second predetermined threshold, control the driver to generate the pulsed signal experienced by the power source.

In other features, the filter is a low pass filter.

In other features, the one or more control modules are configured to generate the pulsed signal to sweep a frequency range, determine impedance response over the frequency range, and determine the characterization parameter based on the impedance response over the frequency range.

In other features, the one or more control modules are configured, while in the impedance determination mode, to adjust phase magnitudes of phases of the motor to balance thermal energy of the phases of the motor.

In other features, the one or more control modules are configured to operate in the impedance determination mode while charging the power source.

In other features, the one or more control modules are configured to operate in the impedance determination mode while not charging the power source.

In other features, the one or more control modules are configured to: determine a temperature based on the impedance; and adjust cooling of the power source based on the temperature.

In other features, the motor drive system further includes the power source, where the one or more control modules are configured to control allocated connection of cells of the power source to load terminals based on the impedance.

In other features, the motor drive system further includes the power source, where the one or more control modules are configured to control connected states of cells of the power source based on the impedance.

In other features, a method of operating a motor drive system is provided. The method includes: receiving power at an inverter from a power source via a bus, where the inverter is connected to a motor of a vehicle; driving the inverter via a driver; filtering a current signal received from the bus to generate a filtered signal; and operating in an impedance determination mode. The impedance determination mode includes: based on the filtered signal, controlling the driver and the inverter to generate a pulsed signal applied to the power source; determining a current level and a voltage of the power source due to the generating of the pulsed signal; and determining impedance based on the current level and the voltage. The method further includes: determining a characterization parameter of the power source based on the impedance; and performing a control operation or a countermeasure based on the characterization parameter.

In other features, the method further includes, while in the impedance determination mode, generating the pulsed signal to include (i) motor magnetizing flux current, and (ii) a torque producing current of less than a predetermined threshold.

In other features, the method further includes, while in the impedance determination mode, generating the pulsed signal to include (i) motor magnetizing flux current, and (ii) zero torque producing current.

In other features, the method further includes: determining whether at least one of the vehicle is stopped, back electromagnetic force of the motor is less than a first predetermined threshold, a rotor of the motor is not rotating, or output torque of the motor is less than a second predetermined threshold; and controlling the driver to generate the pulsed signal experienced by the power source when at least one of the vehicle is stopped, the back electromagnetic force of the motor is less than the first predetermined threshold, the rotor of the motor is not rotating, or the output torque of the motor is less than the second predetermined threshold.

In other features, the method further includes: generating the pulsed signal to sweep a frequency range; determining impedance response over the frequency range; and determining the characterization parameter based on the impedance response over the frequency range.

In other features, the method further includes, while in the impedance determination mode, adjusting phase magnitudes of phases of the motor to balance thermal energy of the phases of the motor.

In other features, the method further includes: based on the impedance, determining at least one of a state of charge of the power source or a state of health of the power source; and performing the countermeasure based on the at least one of the state of charge of the power source or the state of health of the power source.

In other features, the method further includes operating in the impedance determination mode while not charging the power source.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

In a laboratory setting, electrochemical spectroscopy (EIS) may be used to characterize battery cell performance. EIS typically requires specialized and expensive equipment.

The examples set forth herein include incorporation of a bus current control loop to introduce pulsed signals to a power source within a vehicle for impedance response calculations within a vehicle. Impedances of the power source are calculated based on detected current and voltage levels of the power source as a result of generating the pulsed signals. The pulsed signals are introduced under certain conditions and via an inverter of a motor inverter circuit. The motor inverter circuit includes a motor (e.g., a motor used for propulsion purposes) and an inverter that controls operation of the motor. The inverter may be controlled to generate pulses at preselected and/or varying frequencies for impedance response calculations.

The disclosed examples include characterization analysis of power sources including determining various power source characterization parameters, such as state of charge (SOC), state of health (SOH), temperature, etc. The characterization parameters are determined based on impedance responses. SOC refers to a level of charge of a power source relative to a capacity of the power source. SOH refers to a ratio of a current maximum charge of a power source charge relative to a rated capacity of the power source. SOH is related to aging of the power source. The characterization parameters may be used for power source allocation and control and for thermal mitigation purposes, as further described below. The characterization analysis may be embedded into a power source charging process and/or service to monitor the characterization parameters for control, diagnostic and prognostic purposes. The diagnostic and prognostic operations may be predictive.

The term "power source" as used herein may refer to a battery pack, a battery module of a battery pack, and/or a cell of a module of a battery pack. A battery pack may include multiple battery modules, which in turn may each include hundreds of cells. Thus, a power source may include multiple power sources. A power source may further include a cooling circuit, sensors, switches, terminals, a control module, etc.

Figure 1:
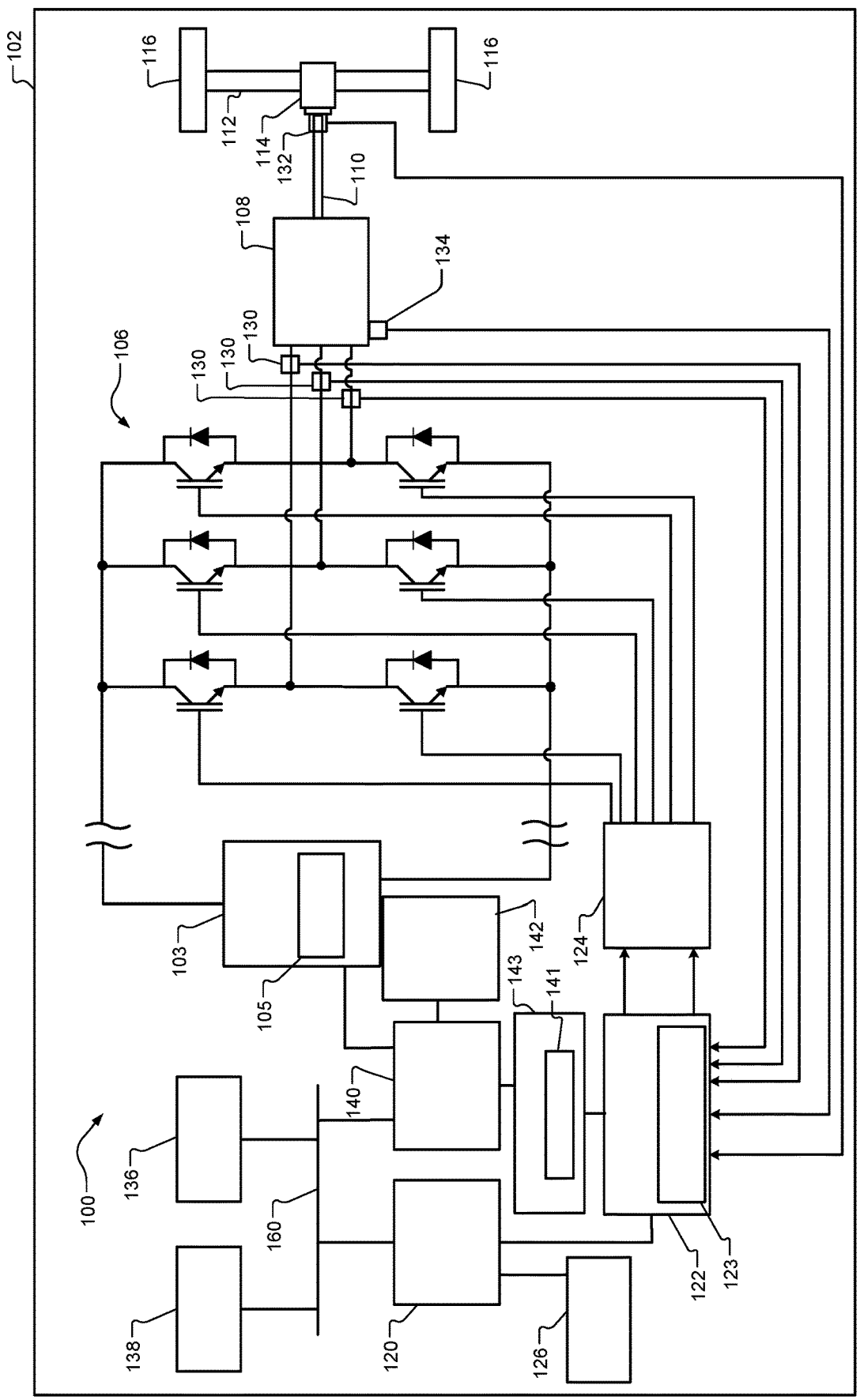
FIG. 1 is a functional block diagram of an example of a propulsion system including a propulsion control module with a bus current control module in accordance with the present disclosure.

FIG. 1 shows a propulsion system 100 of a vehicle 102 that including a power source 103 including battery packs 105. The battery packs 105 may include any number of battery packs. Each battery pack may include any number of battery modules and each battery module may include and number of cells. Examples of power sources are shown in FIGS. 2-3 and 6-10.

The power source 103 may supply power to an inverter 106, which in turn drives a motor 108 (e.g., an interior permanent magnet (IPM) motor). Although the motor 108 is shown as an IPM motor, the motor 108 may be a surface permanent magnet motor or other type of electric motor. Although various examples are disclosed herein with respect to a motor, the examples are applicable to other electric machines. The power source 103 may include multiple cells, battery modules and/or battery packs that are connected in series and/or in parallel to provide predetermined voltage outputs.

The propulsion system 100 is used to move the vehicle 102 and further includes a shaft 110, an axle 112 including a differential 114 and wheels 116. The inverter 106 converts a DC voltage to a three-phase alternating current (AC) to power the motor 108. The motor 108 rotates the shaft 110, which in turn rotates the axle 112 via the differential 114.

The propulsion system 100 further includes a vehicle control module 120, a propulsion control module 122 and a driver 124. The vehicle control module 120 may generate a torque request signal. The torque request signal may be generated based on torque commanded, for example, by an accelerator 126 if included. The propulsion control module 122 may control the driver 124 based on the torque request signal. The driver 124 may, for example, generate pulse width modulation (PWM) signals to control states of transistors of the inverter 106 based on output of the propulsion control module 122.

The propulsion control module 122 may include a bus current control module 123, which may implement an algorithm to generate frequency discharge current pulses for one or more power sources (e.g., cells and/or modules of the battery packs 105). The bus current control module 123 generates frequency discharge current pulses via the inverter 106 that are experienced by the one or more power sources. The battery management module 140 detects current and voltage levels of the one or more power sources to determine impedance responses of the one or more power sources. A different frequency signal (or pulsed signal) may be experienced by different cells, battery modules and/or battery packs based on selective coupling of the cells, battery modules and/or battery packs to the inverter. As an example, each battery module may have a respective chemical makeup, size, shape, etc. and thus be allocated a respective set of one or more frequency signals. Each frequency signal may have a respective duty cycle profile, amplitude profile, and frequency profile. In one embodiment, a same set of frequency signals are generated and experienced by two or more power sources. Application of the frequency signals and monitoring of impedance responses of the power sources allows for on-board characterization analysis of the power sources. Impedances 141 may be calculated and stored in memory 143. The battery management module 140 may store the impedance responses and/or impedance values in the memory 143. Impedance response determination is further described below with respect to FIGS. 2-11.

The propulsion control module 122 controls the driver 124 based on outputs from sensors. The sensors may include current sensors (e.g., Hall Effect sensors 130), a resolver 132, a temperature sensor 134, and/or other sensors 136 (e.g., an accelerometer). The current sensors may include sensors other than Hall Effect sensors.

The propulsion control module 122 performs a transformation of current phase signals Ia, Ib and Ic for the three phases of the motor to current vector signals Id and Iq. The propulsion control module 122 determines how much current is flowing and how much current is needed (or requested) and modifies input current levels of the motor 108 by adjusting output voltage vector signals supplied to the driver 124. This is based on (i) the current vector signals Id, Iq, (ii) the position signal out of the resolver 132, and (iv) the torque request signal from the vehicle control module 120.

A propulsion system 100 may include one or more electric motors. Each electric motor may be used to drive one or more axles and/or one or more wheels of the vehicle 102. As an example, an electric motor may be used to drive an axle of the vehicle 102 via a differential. The vehicle control module 120, based on a torque request, may signal the electric motor to rotate an input gear of the differential and as a result, the wheels attached to the axle. The vehicle control module 120 may adjust current, voltage and/or power levels of the electric motor to control acceleration, deceleration and/or speed of the vehicle 102.

The propulsion system 100 further includes a telematics module 138, a battery management module 140 and power source sensors and/or status monitoring devices (referred to as power source sensors 142). The battery management module 140 may configure the power source 103 as further described below based on output of the above-stated sensors, speed requests, current traveling speed, torque requests, charge states of battery packs of the power source 103, etc. The power source sensors 142 may include voltage sensors, current sensors, and/or other circuit elements used to monitor open circuit voltages (VOCs), SOCs and/or capacities of the battery packs 105 and/or cells and/or modules of the battery packs 105. The power source sensors 142 may be separate from the battery packs 105 or included in the battery packs 105 and monitor voltages, current levels, SOCs, VOCs, capacities, etc. of cells and/or modules of the battery packs and/or each of the battery packs 105 as a whole unit. The battery management module 140 may isolate one or more cells and/or battery packs 105 when: operating inappropriately; not charging to a predetermined voltage level; outputting a voltage and/or an amount of current at level(s) below predetermined minimum level(s); and/or exhibiting another abnormality. The modules 120, 138, 140, and sensors 136 may be connected and/or communicate with each other via a network 160 or other form of communication.

Figure 2:
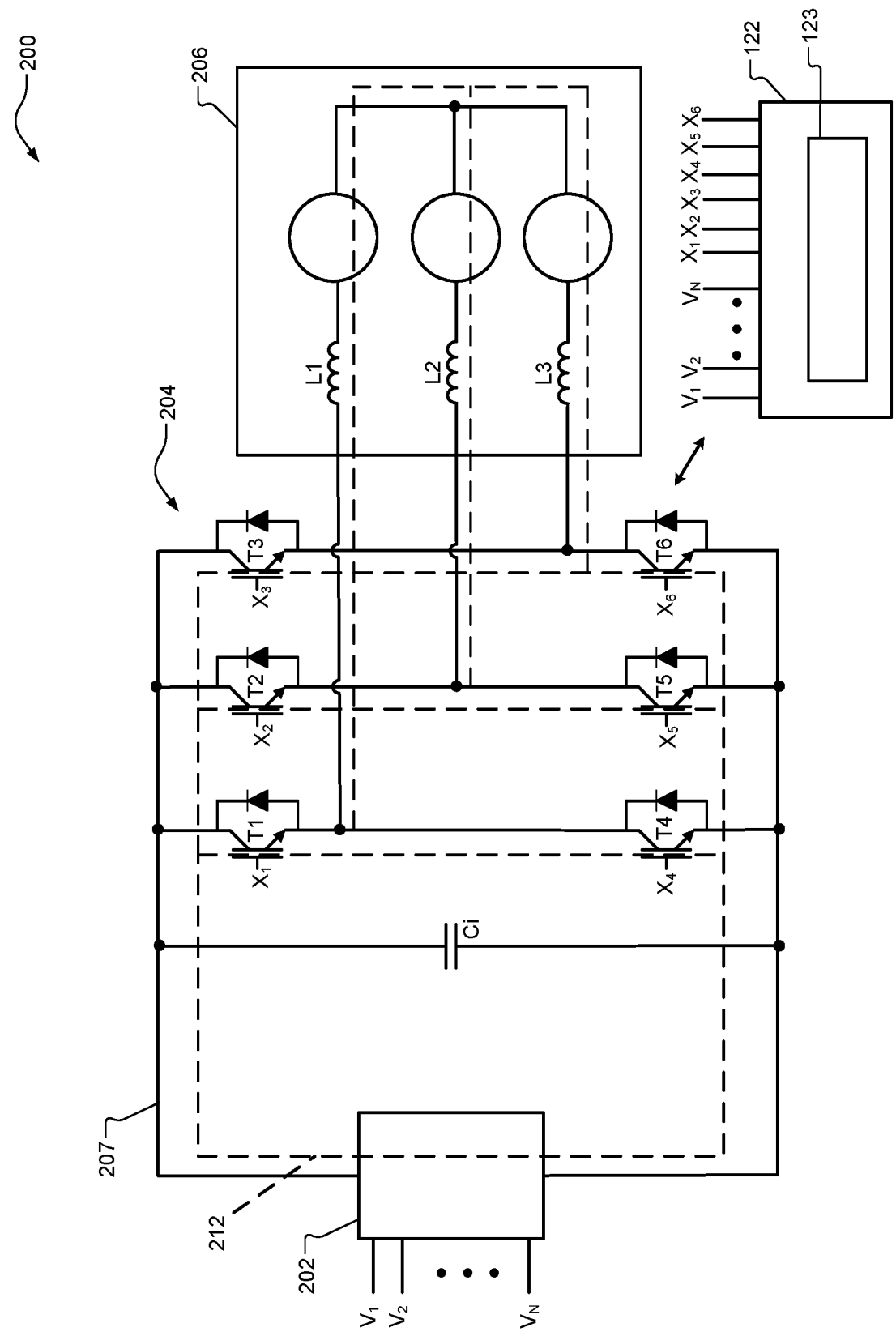
FIG. 2 is a functional block diagram of an example of a motor inverter circuit controlled by the bus current control module illustrating discharge current in accordance with the present disclosure.
Figure 6:
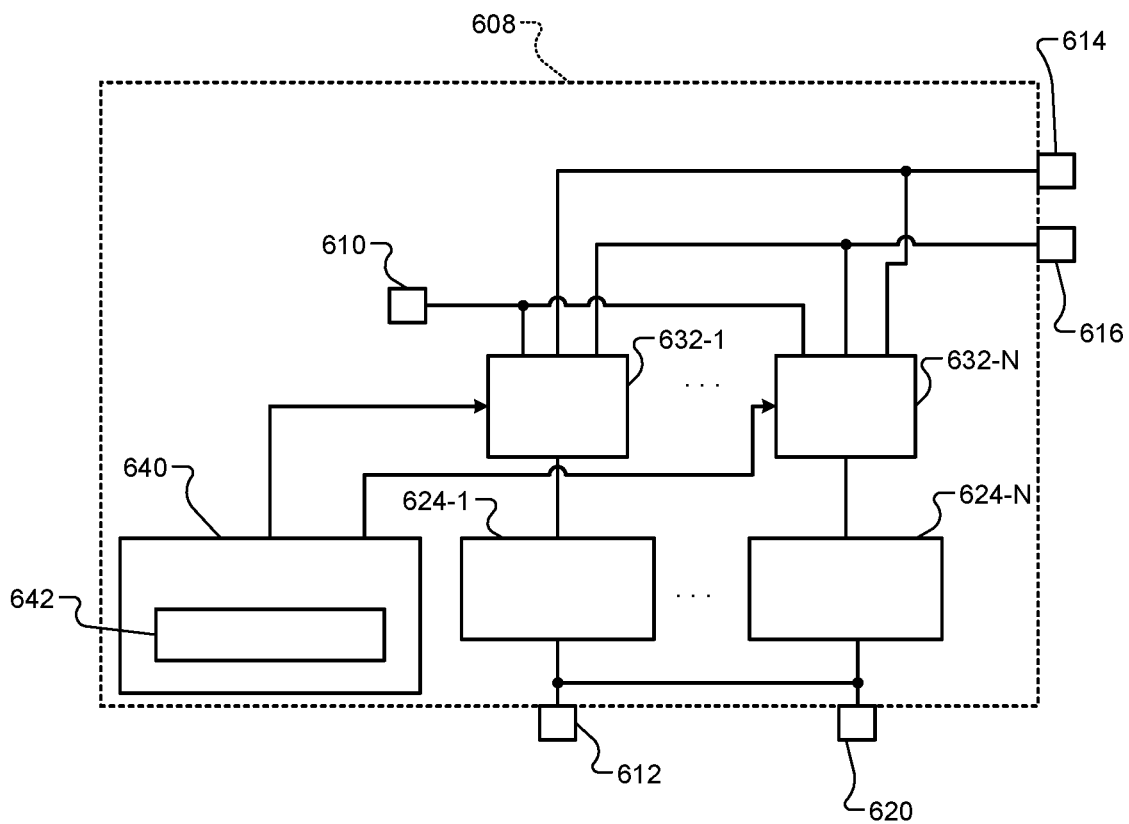
FIG. 6 is a functional block diagram of an example battery pack in accordance with the present disclosure.
Figure 7:
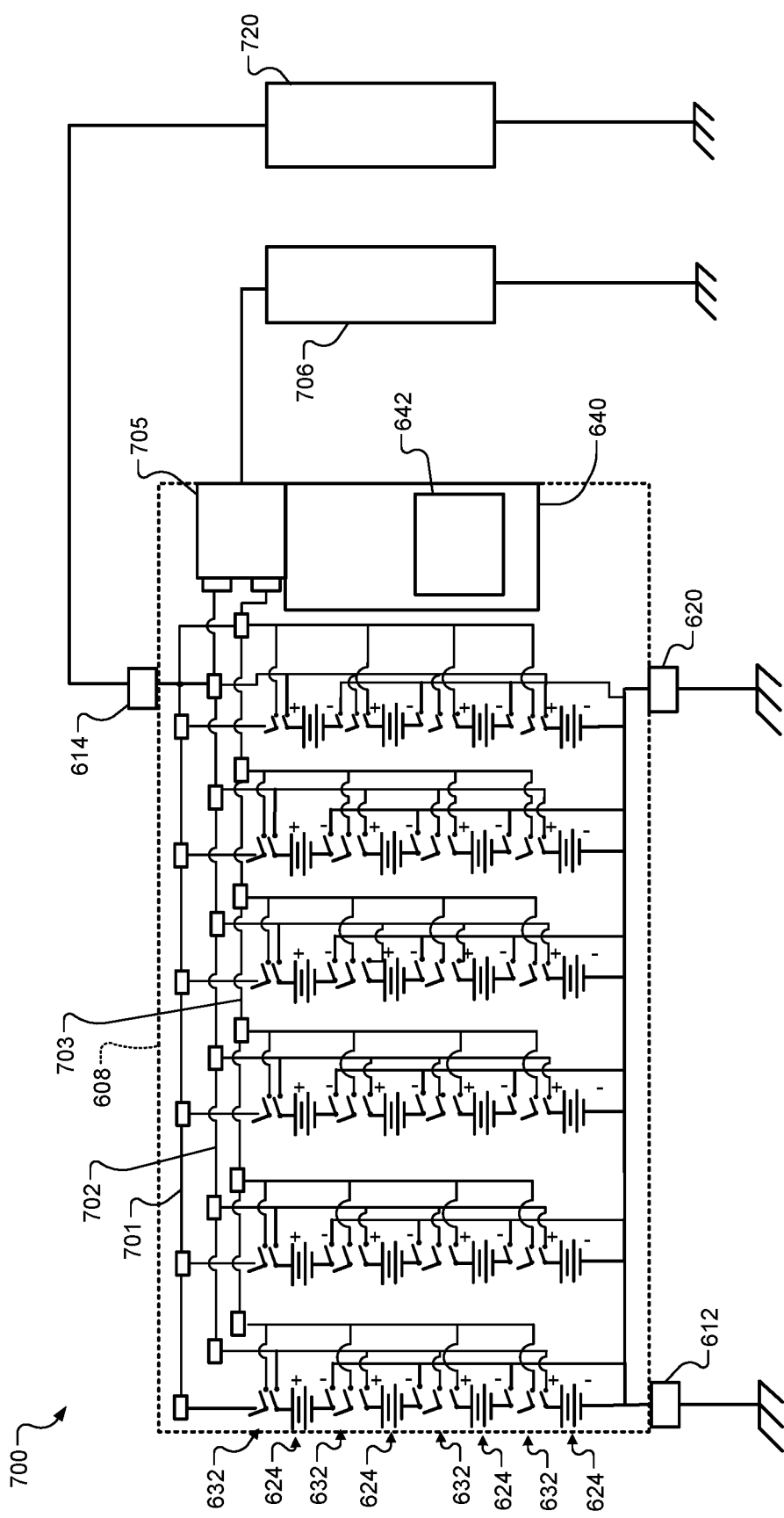
FIG. 7 is a schematic diagram including an example implementation of a the battery pack of FIG. 6.
Figure 9:
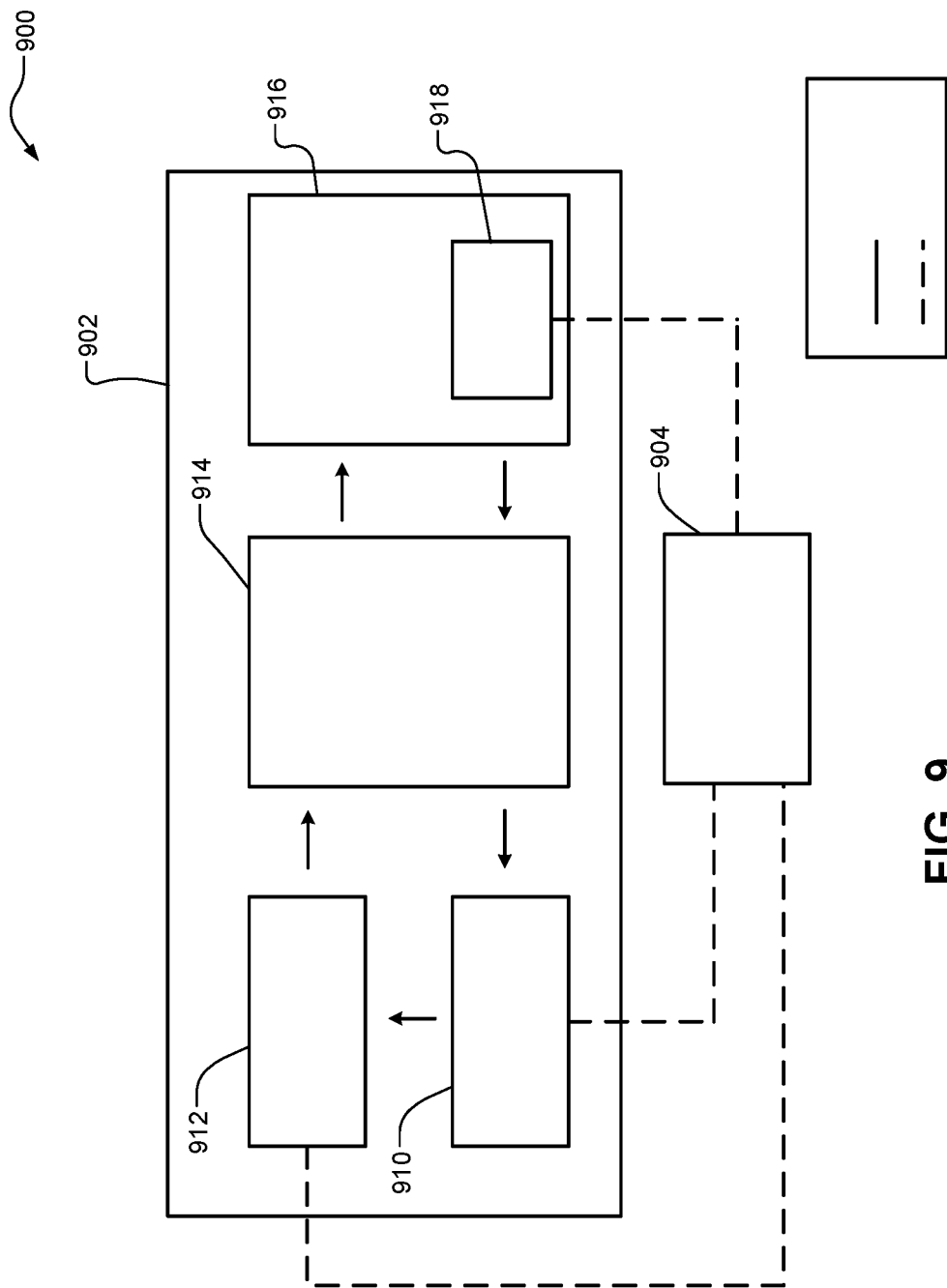
FIG. 9 is a functional block diagram of an example power source cooling system in accordance with the present disclosure.

FIG. 2 shows a motor inverter circuit 200 controlled by the bus current control module 123. The motor inverter circuit 200 includes a power source 202, an inverter 204, a motor 206 and the propulsion control module 122. The power source 202 may include any of the power sources disclosed herein, which may be selectively connected to the inverter 204. FIGS. 6-7 and 9 provide example circuits for selective connection of cells to an inverter, wherein one or more of the shown loads is a motor inverter circuit.

The bus current control module 123 may operate in a spectrum (or impedance determination) mode to generate charge/discharge current pulses. The bus current control module 123 controls operation of the inverter 106 including states of the transistors T1-T6 via control signals X1-X6 to generate, for example, a discharge current profile for power source impedance calculations. Control of states of inverter transistors is further described below. Dashed lines 212 are shown to represent discharge current flowing through the transistor-diode pairs of the inverter 106, the inductors L1-L3 of the motor 206, and the power source 202.

In one embodiment, the current pulses are generated when the corresponding vehicle is stopped (i.e., not moving) and the motor 206 is producing (i) below a predetermined level of torque (e.g., less than 2.5 Newton-meters (Nm)), or (ii) zero output torque. The current pulses are experienced on a bus 207 between the power source 202 and the inverter 204. In one embodiment, the rotor of the motor 206 is not moving while operating in the impedance determination mode. The vehicle may be parked or in an idle mode. During this period the back electromagnetic force (BEMF) of the motor 206 may be below a first predetermined threshold (e.g., less than 1 Volt) or zero. The main or only current supplied to the motor 206 is Id current (referred to as the motor magnetizing flux current) while operating in the impedance determination mode. The Iq current (referred to as the torque producing current) is below a calibrated value at which machine torque is below a second predetermined threshold (e.g., 5 Nm) or zero. The second predetermined threshold may refer to a threshold at which the motor 206 would rotate a rotor of the motor 206 and/or move the corresponding vehicle. Below the second predetermined threshold, the rotor of the motor does not rotate and/or the vehicle does not move. If the rotor were rotating, it would be difficult to distinguish between generated signal current applied to a power source and back current generated due to rotation of the rotor of the motor 206. A profiled bus current control loop is used to generate the Id current, as further described below with respect to FIGS. 3-4 and 10A-10B. For simple control applications, an open loop calibrated Id current and zero Iq current may be generated.

The propulsion control module 122 and/or the battery management module 140 of FIG. 1 may detect voltages V1-VN of cells and/or battery modules of the power source 202. These voltages and the current through the power source may be used to determine impedances of the cells and/or battery modules as described herein.

Figure 3:
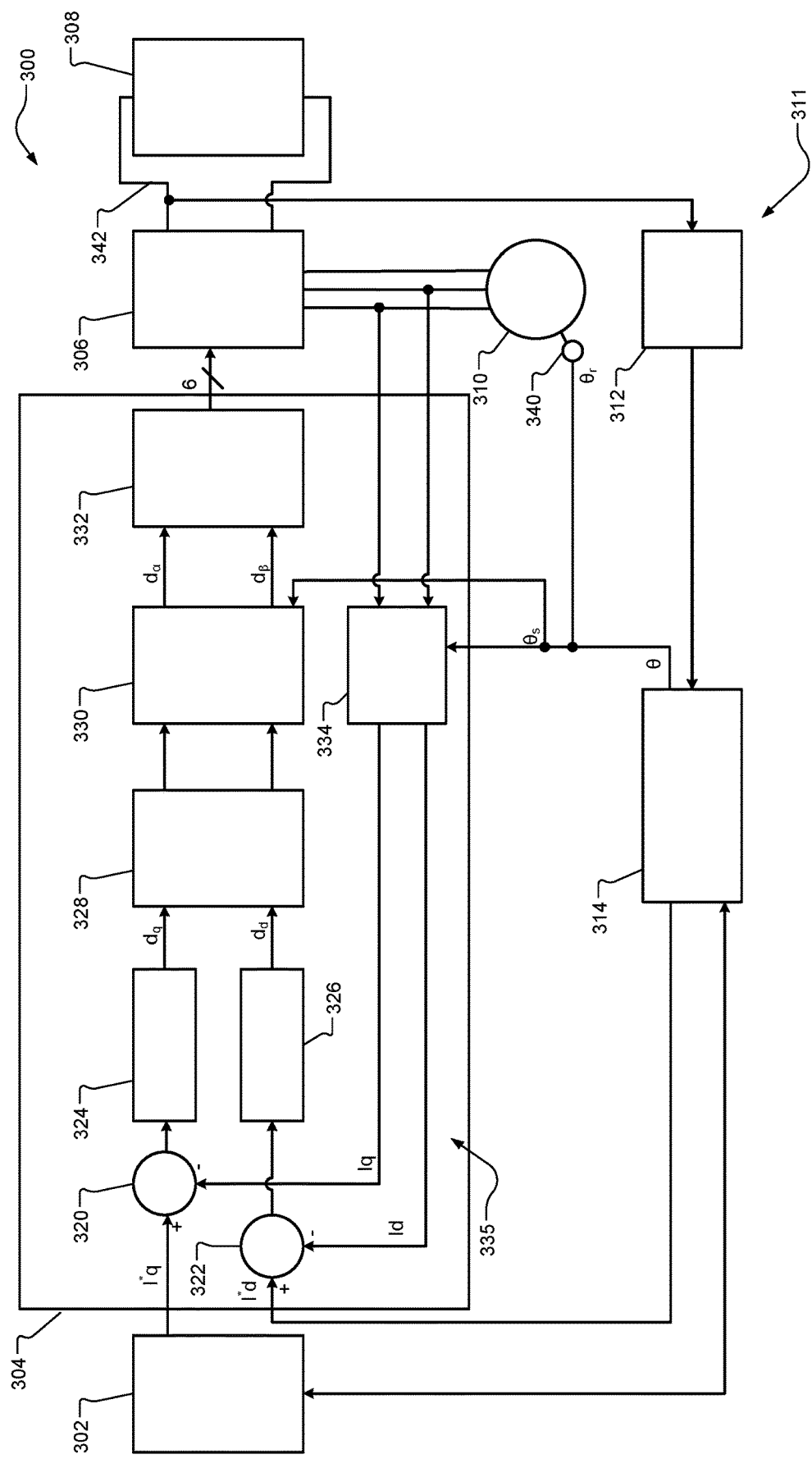
FIG. 3 is a functional block diagram of an example, of a motor drive circuit including a bus current control loop in accordance with the present disclosure.

FIG. 3 shows an example, of a motor drive system (or circuit) 300 including a propulsion control module 302, a driver 304, an inverter 306, a power source 308, a motor 310 and a bus current control loop 311. The bus current control loop 311 includes a low pass filter 312, a bus current control module 314 and/or the propulsion control module 302. The bus current control module 314 may be separate from and communicate with the propulsion control module 302, as shown, or may be part of the propulsion control module 302. The modules 302, 314 may be implemented similarly as other propulsion and bus current control modules disclosed herein.

The driver may include summers 320, 322, proportional integral (PI) control modules 324, 326, a limiting module 328, a first converter 330, a pulse width modulation (PWM) module 332 and a second converter 334. The first summer 320 receives an I*q signal from the propulsion control module 302 indicating a request for zero Iq current. The second summer 322 receives an I*d signal from the bus current control module 314 indicating an amount of Id current to generate. An Id current profile to be generated is provided by the bus current control module 314.

A difference between I*q and Iq from the second converter 334 is provided as a first error signal to the first PI control module 324. A difference between I*d and Id from the second converter 334 is provided as a second error signal to the second PI control module 326. Voltage outputs of the PI control modules 324, 326 are $d_q$, $d_d$. The voltages $d_q$, $d_d$ are provided to the limiting module 328, which limits the outputs of the limiting module to be within predetermined voltage ranges. The first converter 330 converts the voltages $d_q$, $d_d$ to voltages $d_\alpha$, $d_\beta$ for controlling generation of PWM signals out of the PWM module 332. The voltages $d_\alpha$, $d_\beta$ are generated based on a position adjustment signal θ or a summation signal $\theta_s$. The position signal θ is generated by the bus current control module 314. The position summation signal $\theta_s$ is described below. The PWM module 332 generates six PWM signals to control states of the transistors of the inverter 306.

The second converter 334 provides a feedback loop 335 and detects currents of two of the phases of the motor 310 and converts the stationary frame current Ia and Ib to rotationary frame current Iq and Id signals indicative of the Iq and Id current levels. This conversion is based on the position adjustment signal θ. The position adjustment signal θ is summed with a position signal $\theta_r$, which is indicative of a position of a rotor of the motor 310. The position signal $\theta_r$ may be generated by a sensor 340. More specifically, the conversion made by the second converter 334 is based on a sum of the position adjustment signal θ and the position signal $\theta_r$, represented as the summation signal $\theta_s$. The position signal $\theta_r$ is directly related to a rotational angle $\omega_r$ of the rotor.

The low pass filter 312 low pass filters the bus current of the bus 342 supplied from the power source 308 to the inverter 306. The filtered bus current is designated $I_{busfil}$. The filtered bus current $I_{busfil}$ is provided to the bus current control module 314. The bus current control module 314 generates the I*d current signal and the position adjustment signal based on the filtered bus current.

Figure 4A:
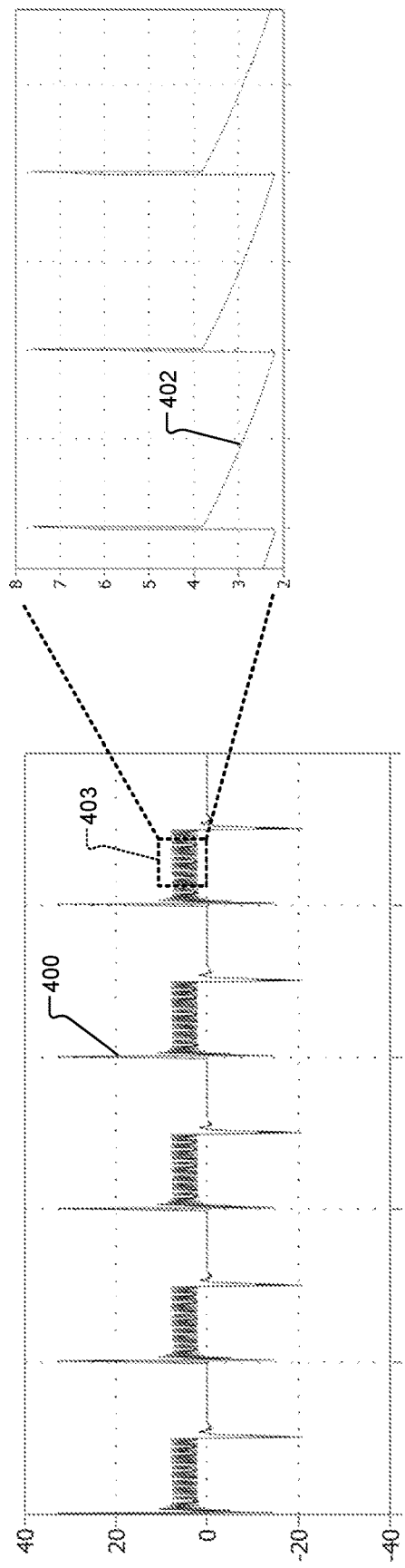
FIG. 4A is an example plot of unfiltered oscillating bus current supplied for impedance response calculations prior to filtering in accordance with the present disclosure.
Figure 4B:
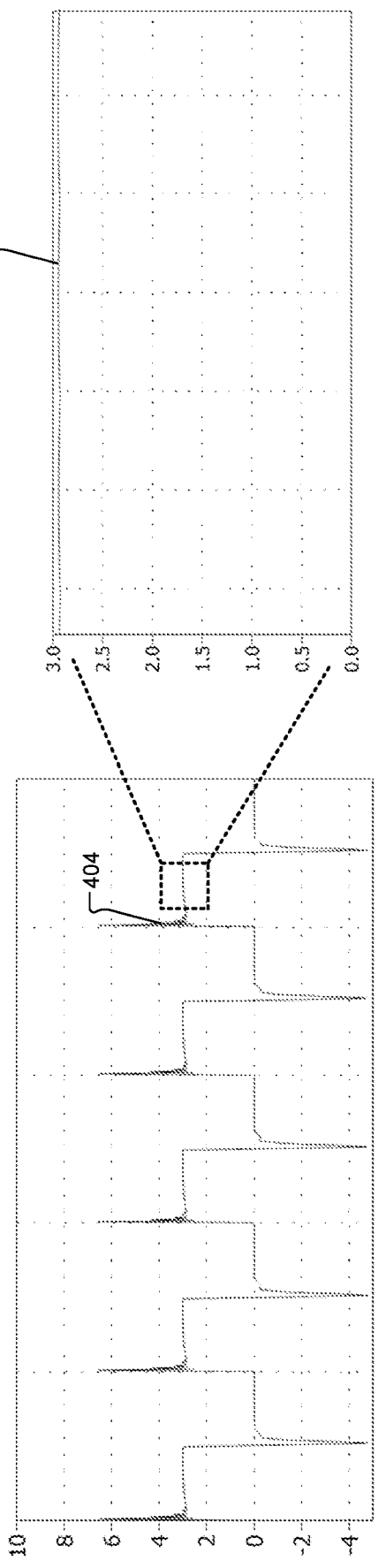
FIG. 4B is an example plot of filtered oscillating bus current introduced for impedance response calculations in accordance with the present disclosure.

The bus current control module 314 controls generation of the I*d current signal and the position adjustment signal θ to provide a target Id current profile, which is experienced by the power source 308. The bus current control module 314 controls the bus current (or current passing through the power source 308 by controlling the Id current. This occurs while the Iq current is zero or below a predetermined threshold. As an example, the commanded bus current (or current Id) may vary between zero and 5 amperes (A)(or 0-200 A for Id current), as shown in FIGS. 4A and 4B. In one embodiment, the bus current is varied between 1-3 A. The bus current control module 314 may control the current Id when the commanded current Id is greater than zero. If the commanded bus current Id is zero, then the bus current control module 314 may be bypassed and the commanded bus current Id is held at a constant value.

Figure 11:
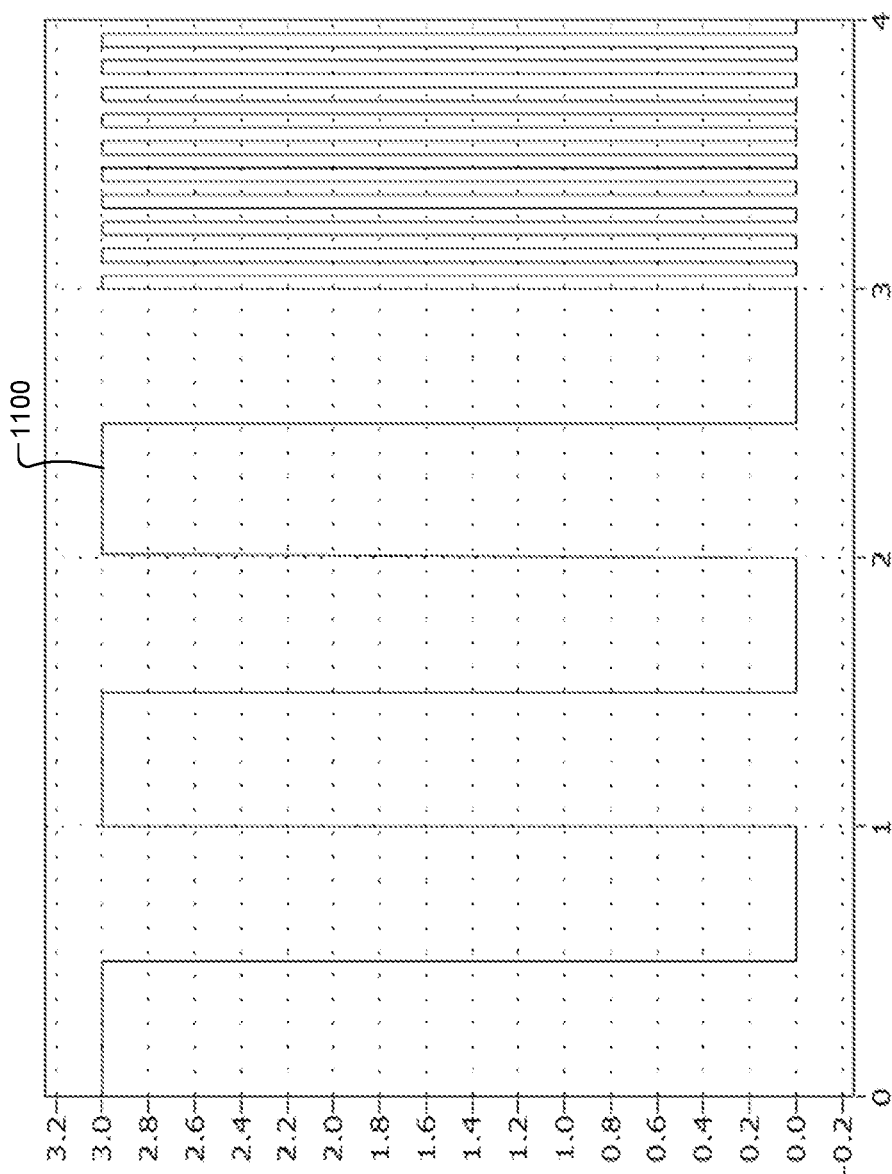
FIG. 11 is an example plot of an Id current profile in accordance with the present disclosure.

An example of the target Id current profile is shown in FIG. 11. FIG. 11 shows a plot of an Id current profile and is designated 1100. The Id current profile includes pulses provided at two different frequencies. Any number of pulses at any number of frequencies may be generated. In one embodiment, the bus current control module 314 sweeps over a frequency range varying the frequencies of a generated pulsed signal over the frequency range. Voltage and current responses of the power source 308 are measured and impedances are calculated over the frequency range to provide an impedance profile for the frequency range. As an example, the frequencies may vary between 0 Hertz (Hz) to 10,000 Hz. As another example, the frequencies may very between 0-1,000 Hz. In another embodiment, one or more sub-frequency ranges are selected within the 0-10,000 Hz range.

FIG. 4A shows a plot 400 of unfiltered oscillating bus current supplied for impedance response calculations prior to filtering. FIG. 4A includes a magnified view of a portion of the plot 400. The magnified view includes a plot 402 of a magnitude of current supplied as one of the pulses of the plot 400. As can be seen in area 403, the bus current includes a high-frequency oscillation, which is due to switching within an inverter. The oscillation can be filtered out as shown by FIG. 4B.

FIG. 4B shows a plot 404 of filtered oscillating bus current introduced for impedance response calculations. FIG. 4B includes a magnified view of a portion of the plot 404. The magnified view includes a plot 406 of a magnitude of current supplied as one of the pulses of the plot 404.

Figure 8:
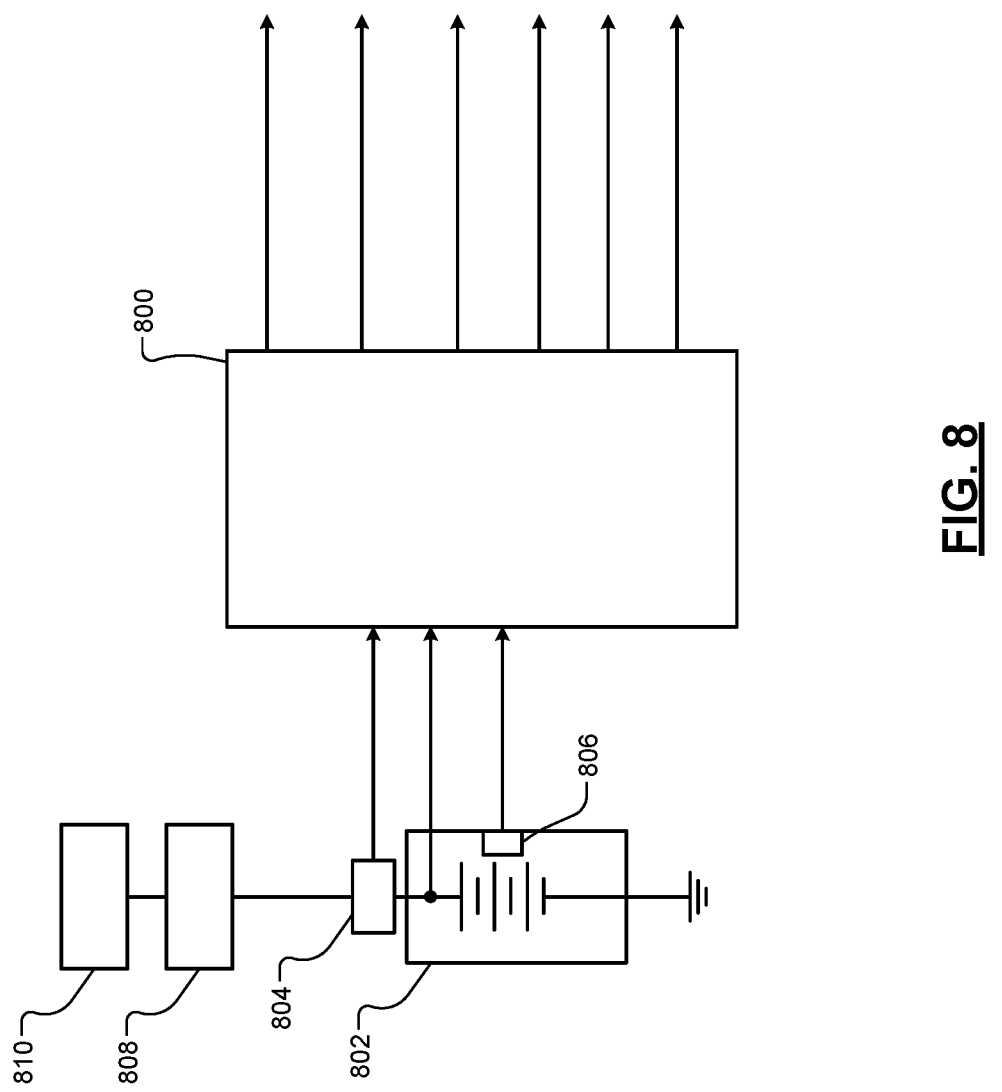
FIG. 8 is a functional block diagram of another example of a vehicle control system including a vehicle control module with an active safety management (ASM) module in accordance with the present disclosure.

Since profiled bus current is small, the unfiltered current ripple (or high-frequency oscillation) due to switching is high enough to cause disturbance for proportional integral derivative (PID) control. The bus current control module 314 of FIG. 3 may be implemented as a PID controller and, when generating the I*d current signal and the position adjustment signal θ, may perform PID control. PID control may be implemented to reduce current transients. For this reason, the detected bus current is filtered by the low pass filter 312. The current and voltage of the power source 308 may be filtered for impedance calculations and corresponding analysis. The current and voltage levels may be detected via sensors, examples of which are shown in FIGS. 1 and 8. The filtering of the current and/or voltage signals does not change alignment in time of the current signal relative to the voltage signal, when, for example, the same or similar type of filters are used. The impedance Z(ω) may be represented by equation (1), where V(ω) is voltage, I(ω) is current, and F(ω) represents the low pass filter function.

$$Z(\omega) = \frac{V(\omega) * F(\omega)}{I(\omega) * F(\omega)} = \frac{V(\omega)}{I(\omega)} \quad (1)$$

Figure 5:
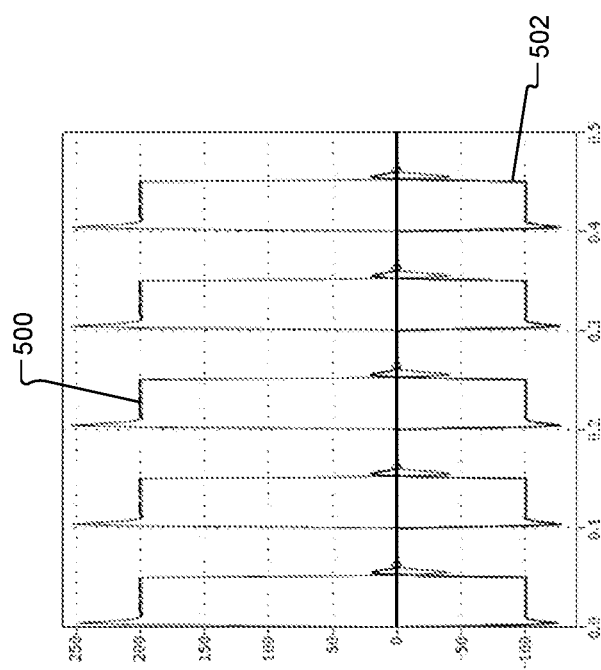
FIG. 5 is an example plot of oscillating current levels of two phases of a motor supplied for impedance response calculations in accordance with the present disclosure.

FIG. 5 shows a plot of three phase currents of a motor supplied for impedance response calculations. Two phase currents with negative values (502), for example Ib and Ic, are same and cannot be identified separately in the plots. In an embodiment, the bus current control module 314 of FIG. 3 may adjust the magnitudes of the current pulses generated at the three phases of the motor 310. This is done to balance thermal loading of the coils of the motor 310. For example, magnitudes of current applied to phases of the motor 310 may be adjusted to balance thermal loading of the phases of the motor 310. For a first predetermined number of cycles, Phase A may have higher current magnitude pulses than Phases B and C. For a second predetermined number of cycles, Phase B may have higher current magnitude pulses than Phases A and C. Phase C may have higher current magnitude pulses than Phases B and C. Each "cycle" in this instance may refer to cycles of the pulsed current signals applied to Phases A-C.

The phase pulse signals have different RMS current due to the rotor of the motor 310 not being rotated (referred to as being at a "standstill" or being in a fixed position). The different RMS current can lead to one of the phases becoming overheated if not compensated for as disclosed herein by balancing thermal loading. The bus current control module 314 implements an alternating phase current generation algorithm to adjust the magnitudes of the pulsed phase signals and timing of the pulsed phase signals.

FIG. 5 shows current magnitude pulses for a first phase and a second phase. The first phase pulse signal is designated 500 and the second phase pulse signal is designated 502. The second phase pulse signal is shown having negative values and has lower magnitude pulses than the first phase pulse signal. Although not shown in FIG. 5, a third phase is present and is the same as the second phase in magnitude. Since machine is assumed to be connected in a star connection arrangement, the sum of three phases is zero at any moment in time. The terms "first", "second" and "third" are used arbitrarily and may refer to any of phases A, B, C of the motor 310 depending on a cycle (or period) of the thermal balancing operation being performed. In this instance a "cycle" may refer to a predetermined period of the thermal balancing operation.

For example, a thermal balancing operation may include three different cycles that may be repeated. The first cycle may include phase A receiving higher magnitude current pulses than phases B and C. A second cycle may include phase B receiving higher magnitude current pulses than phases A and C. A third cycle may include phase C receiving higher magnitude current pulses than phases A and B. This may be accomplished by generating the position adjustment signal θ to adjust the rotor position signal θ$_r$. In the first cycle, θ may be equal to 0. In the second cycle, θ may be equal to $$\frac{2\pi}{3}.$$

In the two cycle, θ may De equal to $$\frac{4\pi}{3}.$$

As a result, the average RMS current over three cycles is the same. This prevents overheating a phase of the motor 310. For each of the three cycles, one of the phases has high current pulse magnitudes, as similarly shown by signal 500 of FIG. 5. The other two phases have small current pulse magnitudes, as similarly shown by signal 502 of FIG. 5.

FIG. 6 shows a battery pack 608 may include multiple source terminals. The battery pack 608 is an example power source that may be implemented as one of the power sources of FIGS. 1-3. Three example source terminals 610, 614, 616 are shown, although any number of source terminals may be included. The source terminals, which may be referred to as positive output terminals, provide respective direct current (DC) operating voltages. The battery pack 608 may include only one negative terminal or may include a negative terminal for each source terminal. The terminals may be high-voltage (e.g., 400 volt (V)) terminals or other terminals at other voltage levels. The battery pack 608 may have a first negative terminal 612 and a second negative terminal 620.

The battery pack 608 includes cells and/or blocks of cells, such as a first block (or string) 624-1 to a Nth block (or string) 624-N ("blocks 624"), where N is an integer greater than or equal to 2. Each of the blocks (or modules) 624 may include one or more cells. The blocks 624 are also individually isolatable, for example, in the event of a fault in a block.

Each of the blocks 624 has its own separate capacity (e.g., in amp hours, Ah). The battery pack 608 includes switches, such as first switches 632-1 to 632-N (collectively "switches 632"). The switches 632 enable the blocks 624 to be connected in series, parallel, or combinations of series and parallel to provide desired output voltages and capacities at the output terminals. Although examples of some switches are shown, other switches may be included to perform the various operations disclosed herein.

A battery control module 640 includes an active safety management (ASM) module 642 and may control the switches 632 to provide desired output voltages and capacities at the source terminals. The battery control module 240 controls the switches 632 to vary the capacity provided at the source terminals based on a present operating mode of the vehicle, as discussed further below. The ASM module 642 may also control the stated switches 632 to disconnect, isolate, test and/or reconnect blocks of cells from the power grid, which includes the other blocks of cells, source terminals, negative terminals, etc. Operations of the ASM module 642 are further described below.

FIG. 7 shows a vehicle electrical system 700 including an example implementation of the battery pack 608. The battery pack 608 includes the source terminal 614 respective power rails 701, 702, 703, the battery control module 640, and a power control circuit 705, which may be connected to the battery control module 640 and vehicle control module (VCM) and/or body control module (BCM) 706. The VCM and/or BCM 706 may operate similar as, include and/or be implemented as an electronic control module (ECM). Power rail 703 may be a redundant power rail and/or used for different loads than the power rail 702. The battery control module 640 including the ASM module 642, the power control circuit 705, the VCM and/or the BCM 706 may communicate with each other via a controller area network (CAN), a local interconnect network (LIN), a serial network, wirelessly and/or another suitable network and/or interface.

The battery control module 640 may communicate with the VCM and/or BCM 706 directly or indirectly via the power control circuit 705 as shown.

In the example of FIG. 7, sets of 4 of the blocks 624 (e.g., 100V blocks) are connectable in series (via ones of the switches 632) to the positive terminal 614 and the first negative terminal 612 to provide a first output voltage (e.g., 400V). Individual ones of the blocks 624 may be connected (via ones of the switches 632) to another positive terminal and the second negative terminal 620 to provide a second output voltage. How many of the blocks 624 are connected to the positive terminal 614 and the other positive terminals dictates the portions of the overall capacity of the battery pack 608 available at each of the positive terminals. Any number of the blocks may be connected in series and any number of series sets may be connected in parallel. In the example of FIG. 7, the blocks 624 are shown with battery symbols. Each block may include any number of cells. The terminal 614 may be connected to a motor inverter circuit 720, which may be any of the motor inverter circuits referred to herein.

FIG. 8 shows an example battery monitoring (or management) system (BMS) module 800 for a block of cells 802 including any number of cells, such as any of the cells and/or blocks of FIGS. 1-3 and 6-7. In one embodiment, the battery monitoring system module 800 is provided for each block of cells as part of an ASM system. In the example shown, the BMS module 800 monitors voltages, temperatures, gas levels, power levels, and/or current levels of the corresponding block of cells 802 and determines certain parameters.

The parameters may include instantaneous charge and discharge power and current limits, short term charge and discharge power and current limits, and continuous charge and discharge power and current limits. The parameters may also include minimum and maximum voltages, minimum and maximum operating temperatures, and SOX limits and/or values. The acronym "SOX" refers to a state of charge (SOC), a state of health (SOH), state of power (SOP), and/or a state of function (SOF). The SOC of a cell, pack and/or group may refer to the voltage, current and/or amount of available power stored in the cell, pack and/or group. The SOH of a cell, pack and/or group may refer to: the age (or operating hours); whether there is a short circuit; whether there is a loose wire or bad connection; temperatures, voltages, power levels, and/or current levels supplied to or sourced from the cell, pack and/or group during certain operating conditions; and/or other parameters describing the health of the cell, pack and/or group. The SOF of a cell, pack and/or group may refer to a current temperature, voltage, and/or current level supplied to or sourced from the cell, pack and/or group, and/or other parameters describing a current functional state of the cell, pack and/or group.

The parameters output by the BMS module 800 may be determined based on the voltages, temperatures and/or current levels monitored. The charge and discharge power and current capability of a block or pack is affected by the minimum and maximum voltages, minimum and maximum operating temperatures, and SOX limits and/or values of the corresponding cells. The BMS module 800 may monitor individual cell voltages, temperatures gas levels, and current levels and determine based on this information the stated parameters. The parameters output by the BMS module 800 are shown as arrow out of the BMS module 800. The parameters received by the BMS module 800 are shown as arrow directed to the BMS module 800. The BMS module 800 may generate safety fault signals when certain safety fault conditions are detected, such as the safety fault conditions referred to herein.

As an example, the BMS module 800 may include and/or be connected to sensors, such as a current sensor 804, the gas sensors and a temperature sensor 806, which may be used to detect current levels through the block of cells 802 (or pack of cells), gas levels of gases in cells, and temperatures of the block of cells 802 (or pack of cells). As an example, a voltage across the block or pack may be detected as shown. In an embodiment, one or more voltage sensors may be included to detect voltages of the block of cells 802. The current sensor 804 may be connected, for example, between the block of cells 802 and a source terminal 808, which may be connected to a load 810. The temperatures, gas levels, voltages, and current levels are reported to the BMS module 800 and/or the ASM module 242 (shown in FIGS. 6 and 7) as some of the parameters received by the BMS module 800.

During operation of an electric vehicle, the battery cells may experience heating due to charging and discharging. Battery life may be adversely impacted by operation for extended periods at higher temperatures. As a result, battery cooling systems may be used to maintain the temperature of the battery system within a predetermined temperature range.

FIG. 9 shows an example power source cooling system 900 that may include a power source 902, a control module 904, a coolant pump 910, valves 912, coolant channels 914, battery cells 916 (or battery modules or battery packs), and sensors 918. The control module 904 may be a battery management module or other control module disclosed herein. The control module 904 may control states of the pump 910 and the valves 912 to control flow of coolant to and from the battery cells 916. This may be based on outputs of the sensors 918, which may include the sensors of FIG. 8 and/or other sensors. This control may also or alternatively be based on impedance calculations and/or power source characterization parameters referred to herein.

Figure 10A:
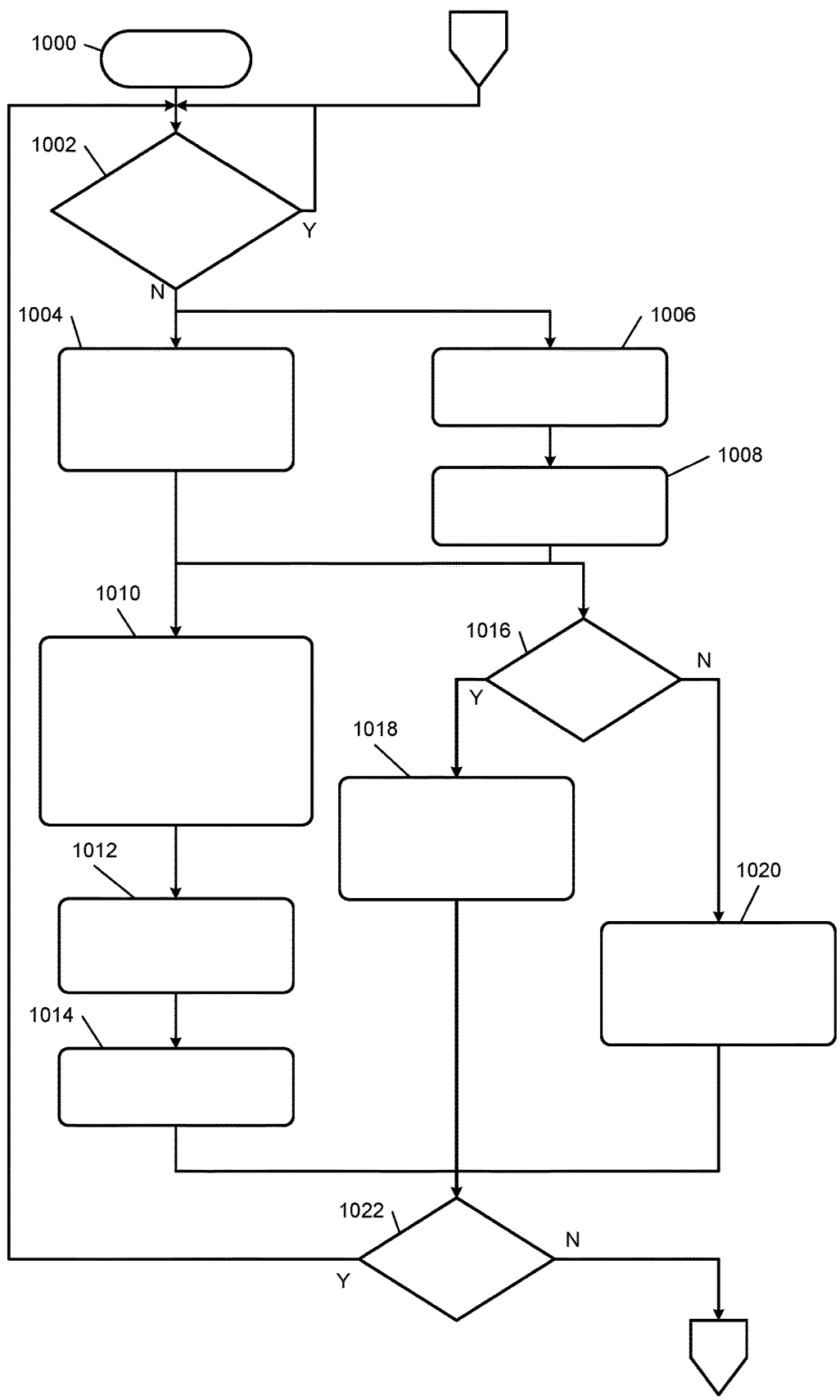
FIGS. 10A-10B illustrate an example impedance based method implemented in accordance with the present disclosure.
Figure 10B:
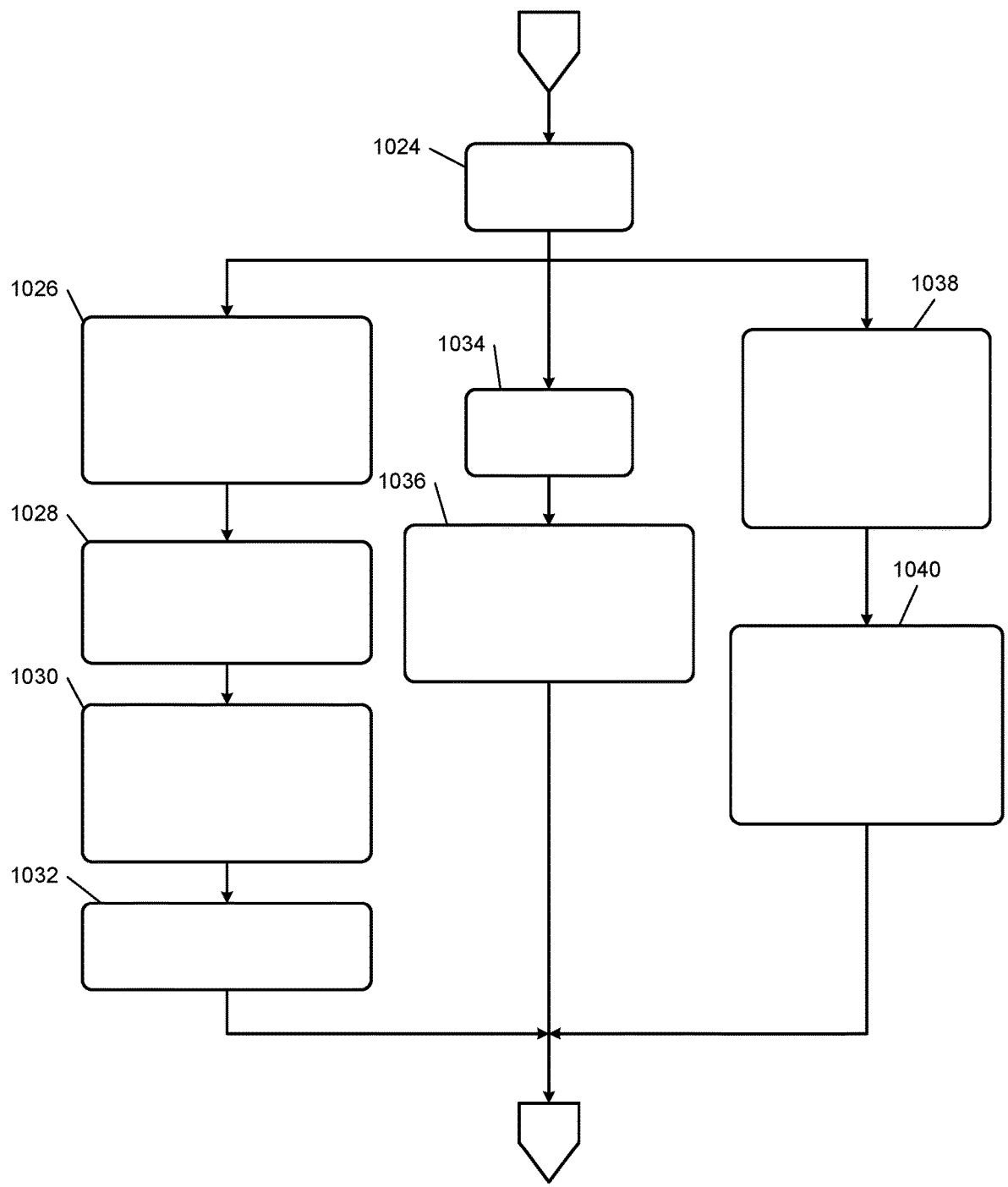

FIGS. 10A-10B illustrate an example impedance based method implemented by one or more of the control modules disclosed herein. FIG. 10 shows an example method implemented by control modules and devices disclosed herein, such as the propulsion control module 302, the low pass filter 312, bus current control module 314, the vehicle control module 120, and/or battery management module 140 of FIGS. 1 and 3 or other control module and/or device disclosed herein. Although the following operations are primarily described with respect to the implementation of FIGS. 1-9, the operations may be easily modified to apply to other implementations of the present disclosure. The operations may be iteratively performed.

The following operations may be performed while operating in the impedance determination mode. The following operations may be performed during or subsequent to charging of battery packs. In one embodiment, at every predetermined (e.g., 20%) increment of SOC, the operations are performed and/or the bus current control module 314 is operating in the impedance determination mode. In another embodiment, when battery packs are not being charged and/or battery packs are not plugged into a charging station, the operations are performed and/or the bus current control module 314 is operating in the impedance determination mode. This may be done at a predetermined SOC for diagnostic and prognostic purposes.

The following operations may be performed for one or more power sources. The operations may be iteratively performed for different power sources. Different pulse signals may be generated during different iterations of this method. During a single iteration, the same generated pulse signals may be supplied to one or more power sources.

The method may begin at 1000. At 1002, the bus current control module 314 may determine whether the corresponding vehicle (e.g., vehicle 102) is moving and/or if machine BEMF is equal to 0. The machine BEMF may refer to the BEMF of the motor 310.

At 1004, the bus current control module 314 may determine a discharge current profile to apply to one or more power sources, such as any of the power sources referred to herein. This may include determining duty cycles, magnitudes, frequencies of pulse signals to be generated and experienced by the power sources. Operation 1004 may be performed in parallel with operations 1006, 1008. Different profiles may be generated for different power sources having different geometries, chemistries, etc.

At 1006, the low pass filter 312 detects (or receives) a current signal from the bus 342. At 1008, the low pass filter 312 filters the current signal.

At 1010, the propulsion control module 302 and/or bus current control module 314 control operation of the converters 330, 334 to generate the Id current while maintaining Iq current below a predetermined threshold and/or or at zero.

At 1012, sensors, such as the sensors of FIGS. 1 and/or 8 may be used to detect current and voltage levels of the power sources. When this operation is performed for multiple power sources, a single current sensor may be used to detect current through power sources connected in series while multiple voltage sensors may be used to detect voltages across each of the power sources.

At 1014, the battery management module 140, 800 and/or other control module may determine and store impedance response (or impedances) of the power sources being monitored. Impedance may be determined based on the current and voltage measurements made at 1012. As an example, an impedance may be set equal to a detected voltage divided by a detected current level for each power source. The impedances of the power sources may be used for diagnostic and prognostic purposes in following operations. The impedances measured during operation 1014 may be stored in the memory 143.

Current reallocation may be performed to balance thermal loading of a motor inverter circuit. For example, magnitudes of current pulses applied to phases of the motor 310 may be adjusted to balance thermal loading of the phases of the motor 310, as described above with respect to FIG. 5. This may be implemented by operations 1016, 1018 and 1020. Operations 1016, 1018, 1020 may be performed while performing operations 1010, 1012, 1014. At 1016, the bus current control module 314 may determine whether the operations are being performed for a first cycle. If yes, operation 1018 is performed, otherwise operation 1020 is performed.

At 1018, the bus current control module 314 refrains from modifying the position signal $\theta_r$ supplied to the second converter 334. At 1020, the bus current control module 314 adjusts the position signal $\theta_r$ based on the current cycle (e.g., second or third cycle). This may be done as described above.

Operation 1022 may be performed subsequent to operations 1014, 1018, 1020. At 1022, the bus current control module 314 may determine whether another cycle is to be performed. If yes operation 1002 may be performed, otherwise operation 1024 may be performed.

At 1024, other parameters may be collected, such as parameters determined by other sensors. Examples parameters are described above, such as the parameters referred to with respect to FIG. 8. At 1026, one or more of the stated control modules may determine a SOCs, SOHs and/or other characterization parameters of the power sources based on the impedance responses (or impedances) determined at 1014.

As an example, a SOC of a power source increases with increase in impedance. This relationship is not linear. Each power source may have a respective SOC vs impedance relationship profile. As another example, dendrite growth may occur over time within the power source and the amount of dendrite growth may be detected based on impedance. The SOC and the amount of dendrite growth is related to the SOH of the power source. SOC, dendrite growth and SOH plots and/or relationships may be stored in the memory 143 and used to determine the SOH of the power source.

During each iteration of the impedance determination mode, the SOH may be determined and stored in the memory 143. This may be done for each power source, such as each cell of a battery pack. The history of SOHs of the battery cells may be stored and used for diagnostic and prognostic purposes. As an example, SOHs of different cells may be compared to detect one or more cells that are not operating appropriately and/or are exhibiting issues and/or characteristics associated with aging.

At 1028, one or more of the stated control modules may perform diagnostic operations to detect power source issue(s). As an example, different impedance responses may be associated with different issues, such as a short circuit, a overheating cell, an aged cell, etc. As a power source ages, capacity of the power source decreases, which can affect SOC and SOH. Characteristic curves of changes over time (or historical data) may be reviewed to determine issues. At 1030, one or more of the stated control modules may perform prognostic operations to predict states of cells, modules, and/or battery packs and determine countermeasures to perform to resolve the issue(s).

At 1032, one or more of the stated control modules may perform countermeasure(s). This may include isolating and/or disconnecting faulty and/or improperly operating battery cells and/or modules, informing an operator of faults, generating diagnostic trouble code(s), etc. Alert signals may be generated to alert a vehicle operator and/or a central monitoring station of detected issues and/or provide indications that service is needed.

At 1034, the battery management module may determine load requirements of loads powered by the power sources. At 1036, the battery management module may control connected states of the cells of the power sources based on the determined impedances and/or the other determined parameters.

At 1038, one or more of the stated control modules may detect increased power source temperatures and/or one or more thermal hot spots in the power sources based on the determined impedances. A temperature of each power source may be determined using determined impedance for that power source. Use of the power source temperature estimates based on impedance in conjunction with the measured temperature from sensors on the power source allows for improved battery thermal health monitoring and management.

As an example, a small amplitude current excitation signal may be supplied at a selected frequency to the power sources and the corresponding current and/or voltage response of the power sources are measured. This may be performed during the above-stated operations 1010, 1012, 1014. These measurements can be used to determine impedances of the power sources and to estimate temperatures of the power sources. When the current and/or voltage response measurements are performed at different frequencies, SOCs and temperatures, impedance spectrums of the power sources can be obtained.

The response results are typically shown graphically with Nyquist plots of the imaginary vs. real impedance for different frequencies and SOCs. In other words, the internal temperature of a power source is a function of a determined impedance of the power source, SOC of the power source, and frequency (e.g., Temperature (T)=f(Z, SOC, frequency). With the impedances, SOCs and frequencies are known, the battery internal temperature can be estimated. In some examples, lookup tables or a mathematical model are used. As a result, the battery management module and/or other control module is able to use individual power source temperature as an input parameter, complementing and/or improving power source SOC, SOH and/or other characterization parameter determinations.

Temperature determinations based on determined impedances improves accuracy and robustness of temperature profiles of a power source. This improves diagnostic and/or prognostic operations that use power source temperature estimates as an input for power source management and control.

At 1040, the control module 1004 may, based on the estimated and/or determined temperatures, increase cooling to one or more power sources, provide directed cooling to one or more thermal hot spots, and/or perform other countermeasures to prevent thermal runaways and/or overheating. This may include increasing flow of coolant around and through the one or more power sources.

The above-described operations of FIG. 11 are meant to be illustrative examples. The operations may be performed sequentially, synchronously, simultaneously, continuously, during overlapping time periods or in a different order depending upon the application. Also, any of the operations may not be performed or may be skipped depending on the implementation and/or sequence of events.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information, but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A motor drive system of a vehicle, the motor drive system comprising:
an inverter configured to receive power from a power source via a bus, wherein the inverter is connected to a motor of the vehicle, the power source being separate from the motor and comprising at least one of a battery pack, a battery module, and a cell of a battery module;
a driver configured to drive the inverter;
a filter configured to filter a current signal received from the bus to generate a filtered signal; and
one or more control modules configured to
operate in an impedance determination mode including
based on the filtered signal, control the driver and the inverter to generate a pulsed signal applied to the power source,
determine a current level and a voltage of the power source due to generation of the pulsed signal, and
determine impedance based on the current level and the voltage,
determine a characterization parameter of the power source based on the impedance; and
perform a control operation or a countermeasure based on the characterization parameter.

2. The motor drive system of claim 1, wherein the one or more control modules are configured, while in the impedance determination mode, to generate the pulsed signal to include (i) motor magnetizing flux current, and (ii) a torque producing current of less than a predetermined threshold.

3. The motor drive system of claim 1, wherein, the one or more control modules are configured, while in the impedance determination mode, to generate the pulsed signal to include (i) motor magnetizing flux current, and (ii) zero torque producing current.

4. The motor drive system of claim 1, wherein the one or more control modules are configured to:
determine whether at least one of the vehicle is stopped, back electromagnetic force of the motor is less than a first predetermined threshold, a rotor of the motor is not rotating, or output torque of the motor is less than a second predetermined threshold; and
when at least one of the vehicle is stopped, the back electromagnetic force of the motor is less than the first predetermined threshold, the rotor of the motor is not rotating, or the output torque of the motor is less than the second predetermined threshold, control the driver to generate the pulsed signal experienced by the power source.

5. The motor drive system of claim 1, wherein the filter is a low pass filter.

6. The motor drive system of claim 1, wherein the one or more control modules are configured to generate the pulsed signal to sweep a frequency range, determine impedance response over the frequency range, and determine the characterization parameter based on the impedance response over the frequency range.

7. The motor drive system of claim 1, wherein the one or more control modules are configured, while in the impedance determination mode, to adjust phase magnitudes of phases of the motor to balance thermal energy of the phases of the motor.

8. The motor drive system of claim 1, wherein the one or more control modules are configured to operate in the impedance determination mode while charging the power source.

9. The motor drive system of claim 1, wherein the one or more control modules are configured to operate in the impedance determination mode while not charging the power source.

10. The motor drive system of claim 1, wherein the one or more control modules are configured to:
determine a temperature based on the impedance; and
adjust cooling of the power source based on the temperature.

11. The motor drive system of claim 1, further comprising the power source, wherein the one or more control modules are configured to control allocated connection of cells of the power source to load terminals based on the impedance.

12. The motor drive system of claim 1, further comprising the power source, wherein the one or more control modules are configured to control connected states of cells of the power source based on the impedance.

13. A method of operating a motor drive system, the method comprising:
receiving power at an inverter from a power source via a bus, wherein the inverter is connected to a motor of a vehicle, the power source being separate from the motor and comprising at least one of a battery pack, a battery module, and a cell of a battery module;

driving the inverter via a driver;
filtering a current signal received from the bus to generate a filtered signal;
operating in an impedance determination mode including
based on the filtered signal, controlling the driver and the inverter to generate a pulsed signal applied to the power source,
determining a current level and a voltage of the power source due to the generating of the pulsed signal, and
determining impedance based on the current level and the voltage,
determining a characterization parameter of the power source based on the impedance; and
performing a control operation or a countermeasure based on the characterization parameter.

14. The method of claim 13, further comprising, while in the impedance determination mode, generating the pulsed signal to include (i) motor magnetizing flux current, and (ii) a torque producing current of less than a predetermined threshold.

15. The method of claim 13, further comprising, while in the impedance determination mode, generating the pulsed signal to include (i) motor magnetizing flux current, and (ii) zero torque producing current.

16. The method of claim 13, further comprising:
determining whether at least one of the vehicle is stopped, back electromagnetic force of the motor is less than a first predetermined threshold, a rotor of the motor is not rotating, or output torque of the motor is less than a second predetermined threshold; and
controlling the driver to generate the pulsed signal experienced by the power source when at least one of the vehicle is stopped, the back electromagnetic force of the motor is less than the first predetermined threshold, the rotor of the motor is not rotating, or the output torque of the motor is less than the second predetermined threshold.

17. The method of claim 13, further comprising:
generating the pulsed signal to sweep a frequency range;
determining impedance response over the frequency range; and
determining the characterization parameter based on the impedance response over the frequency range.

18. The method of claim 13, further comprising, while in the impedance determination mode, adjusting phase magnitudes of phases of the motor to balance thermal energy of the phases of the motor.

19. The method of claim 13, further comprising:
based on the impedance, determining at least one of a state of charge of the power source or a state of health of the power source; and
performing the countermeasure based on the at least one of the state of charge of the power source or the state of health of the power source.

20. The method of claim 13, further comprising operating in the impedance determination mode while not charging the power source.

* * * * *